United States Patent [19]

Itoh

[11] Patent Number: 4,732,793

[45] Date of Patent: Mar. 22, 1988

[54] METHOD AND APPARATUS FOR LASER-INDUCED CVD

[75] Inventor: Hiromi Itoh, Hyogo, Japan

[73] Assignee: Mitsubishi Denki Kabushiki Kaisha, Tokyo, Japan

[21] Appl. No.: 10,582

[22] Filed: Feb. 3, 1987

[30] Foreign Application Priority Data

Feb. 7, 1986 [JP] Japan ................................ 61-26125

[51] Int. Cl.⁴ ................................................ B05D 3/06

[52] U.S. Cl. .................................... 427/53.1; 118/620; 118/723; 427/54.1

[58] Field of Search ............................ 427/53.1, 54.1; 118/50.1, 723, 620

[56] References Cited

U.S. PATENT DOCUMENTS 4,649,059 3/1987 Eden et al. ........................ 427/53.1

OTHER PUBLICATIONS

"Laser-Induced Chemical Vapor Deposition of $SiO_2$", P. K. Boyer et al, *Appl. Phys. Lett.*, vol. 40, 1982, pp. 716–718.

*Primary Examiner*—John H. Newsome
*Attorney, Agent, or Firm*—Lowe, Price, LeBlanc, Becker & Shur

[57] ABSTRACT

A laser-induced CVD method in accordance with this invention comprises the steps of: setting a substrate in a reactive gas; applying a laser beam to the reactive gas to decompose it and produce not only free radicals but also ions due to multiphoton absorption; and applying an electric field thereby to efficiently transport the ions toward the substrate and deposit a thin film on the substrate at an increased deposition rate.

8 Claims, 4 Drawing Figures

METHOD AND APPARATUS FOR LASER-INDUCED CVD

BACKGROUND OF THE INVENTION

1. Field of the Invention

This invention relates to CVD (chemical vapor deposition) and more particularly to a method and an apparatus for laser-induced CVD, in which a reactive gas is decomposed photochemically by a laser beam having an extremely high density of photons thereby to deposite a thin film on a substrate.

2. Description of the Prior Art

A laser-induced CVD method is described, for example, by P. K. Boyer et al. in *Appl. Phys. Lett.*, vol. 40, 1982, pp. 716–718.

Referring to FIG. 1, there is illustrated the principle of a laser CVD method in a simplified conceptional front view. A substrate 2 is placed on a susceptor 3 in a reactive gas. A laser beam 1 is set parallel to the top surface of the substrate 2 and is spaced above about 0.5 to a few millimeters therefrom. The reactive gas is decomposed photochemically by the laser beam 1 and deposites a thin film on the substrate 2.

The thin film is deposited on the substrate 2 without direct laser beam irradiation to the substrate 2 as described above, and this is because excited species formed by photochemical decomposition of the reactive gas in the beam pass region are diffused toward the substrate 2.

More specifically, for example, a silicon film is deposited on a substrate in a reactive gas of $SiH_4$ by utilizing an ArF excimer laser (wavelength: 193 nm) or a KrF excimer laser (wavelength: 248 nm) as a light source.

In this case, there is a question in the relation between the absorption spectrum of the $SiH_4$ gas and the spectrum of the excitation light. Generally, in order to cause a photochemical reaction in a reactive gas, it is necessary to coincide the spectrum of the excitation light with the absorption spectrum of the reactive gas. In other words, a photochemical reaction needs a selected spectrum of an excitation light. However, although the spectral absorption of $SiH_4$ usually occurs only in the wavelength region less than about 165 nm, the deposition occurs at a significant rate (several tens to several hundreds Å/min) with the ArF excimer laser having a wavelength of 193 nm or the KrF excimer laser having a wavelength of 248 nm. It is now believed that this wonder fact is caused by multiphoton absorption due to an extremely high density of photons in the laser beam. For example, it is thought that the ArF excimer laser is absorbed not as one-photon absorption (corresponding to a wavelength of 193 nm) but as two-photon absorption (96 nm) or three photon absorption (65 nm).

Actually, possibility of the multiphoton dissociation is strongly suggested by the following fact. The thin film is not deposited by ultraviolet radiation with a relatively lower photon density (e.g., ultraviolet with a wavelength of 185 nm emitted from a low pressure mercury lamp does not cause $siH_4$ to deposite any thin film). Further, even with an excimer laser, there exist a threshold value of the radiation power density for the deposition of a thin film, and a power density of about several $MW/cm^2$ is required.

In the meantime, photo CVD has been thought to be definitely different from plasma CVD in that photo CVD would not involve charged particles such as electrons and ions but involve only free radicals (i.e., excited reactive species without any charge) during deposition process.

In many cases of photochemical reactions due to the multiphoton absorption, however, the reactive gas absorbs an energy higher than ionization potential. As a matter of fact, two photons in an ArF excimer laser beam have an energy of about 13 eV which exceeds the ionization potential of $SiH_4$. Further, in a photoionization experiment of $SiH_4$ with synchrotron orbit radiation, the threshold energy for the photoionization is measured to be 11.5–12.0 eV. The photoionization cross section is maximized at about 13.4 eV, and then mainly $SiH_3^+$ and $SiH_2^+$ are produced.

As described above, when the multiphoton absorption occurs with light such as a laser beam, it is highly probable that ionization is involved in the photochemical reaction.

SUMMARY OF THE INVENTION

From the above described viewpoint, it is a major object of the present invention to provide a method and an apparatus for laser-induced CVD, in which a thin film having an improved quality can be formed at an increased deposition rate by utilizing ionization of a reactive gas due to a laser beam.

A laser-induced CVD method in accordance with the present invention comprises the steps of: setting a substrate in a reactive gas; applying a laser beam to the reactive gas to decompose and produce not only free radicals but also ions due to multiphoton absorption; and applying an electric field thereby to efficiently transport the ions toward the substrate and deposite a thin film on the substrate at an increased deposition rate.

A laser-induced CVD apparatus in accordance with the present invention comprises: a reaction chamber; a vacuum pump for evacuating the chamber; a gas supplier for supplying the chamber with a reactive gas; a susceptor in the chamber for supporting a substrate on which a thin film is to be deposited; a generally flat electrode provided opposite to the susceptor; a laser source for emitting a laser beam to decompose the reactive gas and produce not only free radicals but also ions due to multiphoton absorption; and a DC power supplier connected between the electrode and the susceptor for generating an electric field therebetween, whereby the ions are efficiently transported toward the substrate and thus the film is deposited at an increased deposition rate.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
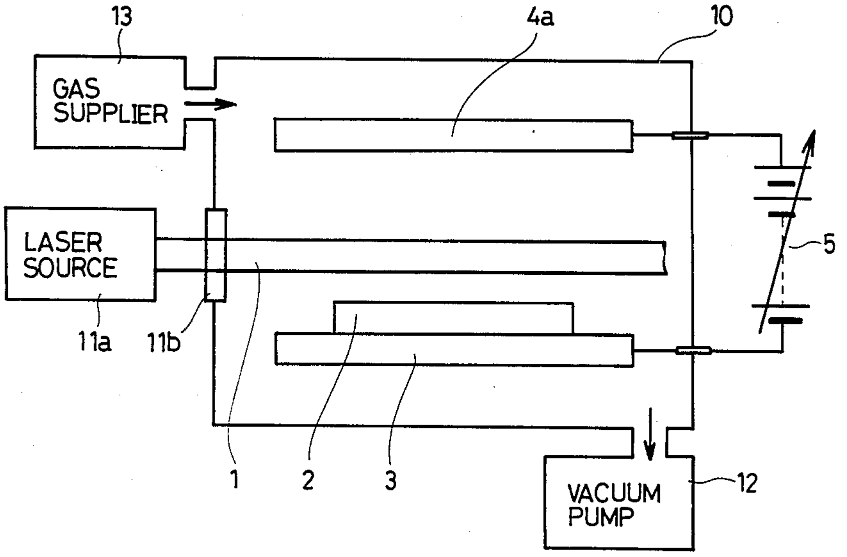
FIG. 2 is a conceptional front view of a laser-induced CVD apparatus in accordance with the present invention.

Referring to FIG. 2, there is conceptionally illustrated a laser-induced CVD apparatus in accordance with the present invention. A substrate 2 is placed on a susceptor 3 in a reaction chamber 10. The reaction chamber 10 is evacuated by a vacuum pump 12 and supplied with a reactive gas from a gas supplier 13. A laser beam 1 is emitted from a laser source 11*a* and applied to the reactive gas through a window 11*b* thereby to decompose the reactive gas and produce not only free radicals but also ions due to multiphoton absorption.

A generally flat electrode 4*a* is also provided in the chamber 10, being opposite to the susceptor 3. The laser beam is set to pass between the susceptor 3 and the electrode 4*a*. Preferably, the laser beam is also set to be substantially parallel to the top surface of the substrate 2 and spaced above about 0.5 to a few mm therefrom. A DC power supplier 5 is connected between the electrode 4*a* and the susceptor 3 for generating an electric field therebetween. The produced ions (generally positive ions) which contribute to deposition of a thin film are accelerated toward the substrate 2 by the electric field.

Figure 1:
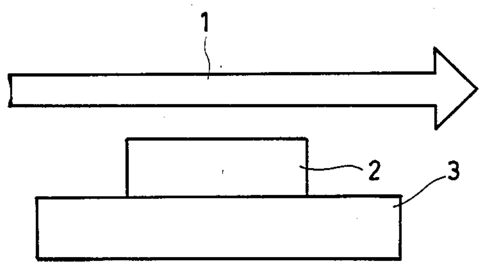
FIG. 1 is a simplified conceptional front view, illustrating the principle of a laser CVD method.

In a conventional laser CVD method without any electric field as shown in FIG. 1, not only free radicals but also ions produced in the beam pass region are diffused in all directions and thus a large part of the ions does not contribute to deposition of a thin film on the substrate 2. In the laser CVD apparatus of FIG. 2, however, almost all ions produced in the beam pass region are accelerated toward the substrate 2 by the electric field between the electrode 4*a* and the susceptor 3. Therefore, those accelerated ions efficiently contribute to deposition of a thin film on the substrate 2 and then flakes deposited on undesirable portions in the reaction chamber 10 are decreased.

Further, the accelerated ions impinging upon the substrate 2 improve not only adhesive force between the deposited thin film and the substrate 2 but also density of the thin film, though there exists a problem that a thin film deposited by a conventional photo CVD method has a relatively lower density.

In the meantime, since accelerating voltage for ions (ion sheath voltage) which occurs inevitably over the surface of the substrate can not be controlled freely in a plasma CVD method, ions having an excess energy may cause a damage on the substrate in some cases. On the other hand, since the accelerating voltage may be controlled freely in the laser CVD apparatus of FIG. 2, a thin film with a good quality can be obtained without causing a damage on the substrate.

Figure 3:
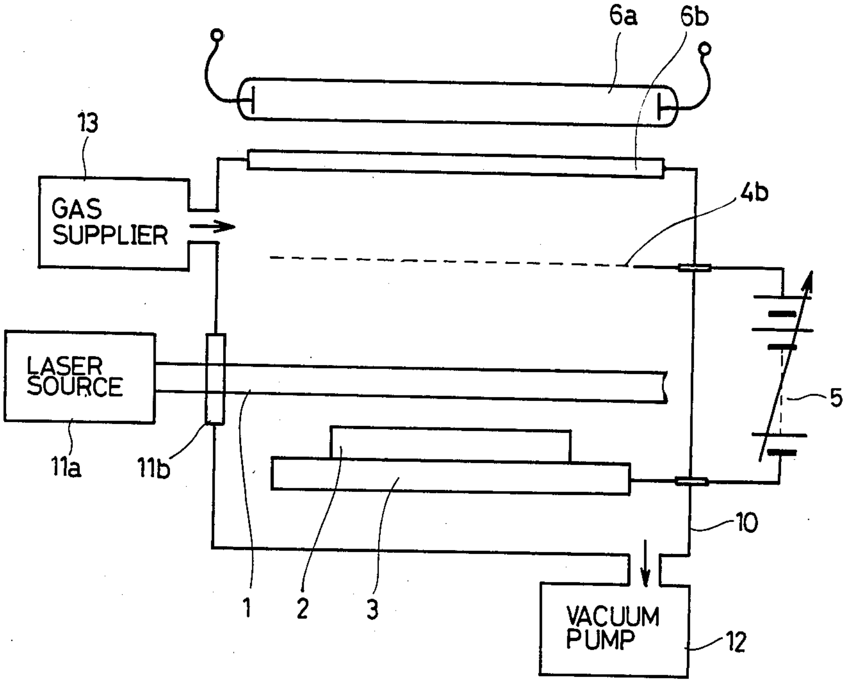
FIG. 3 is a conceptional front view of another laser-induced CVD apparatus in accordance with the present invention.

Referring to FIG. 3, there is conceptionally illustrated another laser CVD apparatus in accordance with the present invention. This apparatus is similar to that of FIG. 2, but provided with a mesh electrode 4*b* instead of the plate-like electrode 4*a*. This apparatus is also provided with a mercury lamp 6*a* for applying ultraviolet to the substrate 1 through a window 6*b* and the mesh electrode 4*b*.

When a thin film of an insulator such as silicon oxide or silicon nitride is deposited on a silicon substrate, the insulator film may be charged up by the incoming ions. If this electrification of the film occurs during deposition, the above described meritorious effects of the present invention will be decreased. However, when the substrate is irradiated by light having an energy higher than the potential barrier at the interface between the substrate and film, electrons can be injected from the substrate into the positively charged film. Accordingly, the electrification of the film can be cancelled and it becomes possible to continuously deposite the film in a steady condition.

Figure 4:
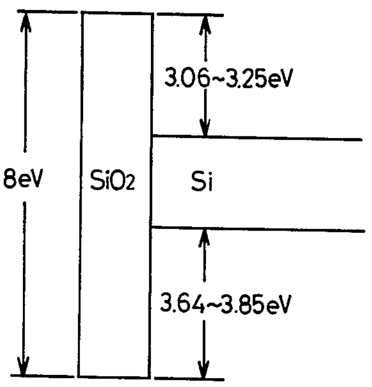
FIG. 4 is an energy band profile in a Si substrate and a $SiO_2$ film on the substrate.

FIG. 4 schematically shows an energy band profile in a silicon dioxide film and a silicon substrate. As exemplarily shown in this figure, the above described potential barrier usually has an energy height in the range of about 4–5 eV (e.g., as to a silicon oxide film or a silicon nitride film on a silicon substrate). Therefore, a practical lamp such as a low pressure mercury lamp (ultraviolet with wavelengths of 185 and 253 nm) or a high pressure mercury lamp (ultraviolet with wavelengths of 200–300 nm) can be used to cancel the above described electrification of an insulator film on a semiconductor substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A laser-induced CVD apparatus comprising;
- a reaction chamber;
- a vacuum pump for evacuating said chamber;
- a gas supplier for supplying said chamber with a reactive gas;
- a susceptor in said chamber for supporting a substrate on which a thin film is to be deposited;
- a generally flat electrode provided opposite to said susceptor;
- a laser source for emitting a laser beam to decompose said reactive gas and produce not only free radicals but also ions due to multiphoton absorption;
- a DC power supplier connected between said electrode and said susceptor for generating an electric field therebetween, whereby said ions are efficiently transported toward said substrate and thus said film is deposited at an increased deposition rate; and
- a mercury lamp means for applying ultraviolet to said substrate, whereby electrification of said film during deposition may be cancelled by electrons injected from said substrate due to a photoelectric effect.

2. An apparatus in accordance with claim 1, wherein said electrode comprises a mesh plate.

3. An apparatus in accordance with claim 1, wherein the output voltage of said DC power supplier is adjustable.

4. An apparatus in accordance with claim 1, wherein said laser beam is set to pass between said susceptor and said electrode.

5. An apparatus in accordance with claim 4, wherein said laser beam is set substantially parallel to the top surface of said substrate and is spaced above about 0.5 to a few mm therefrom.

6. An apparatus in accordance with claim 1, wherein said laser beam has an energy density more than several $MW/cm^2$.

7. An apparatus in accordance with claim 1, wherein said laser source is of a gas laser.

8. An apparatus in accordance with claim 1, wherein said laser source is of an excimer laser.

* * * * *